(12) United States Patent
Abe

(10) Patent No.: US 12,183,865 B2
(45) Date of Patent: Dec. 31, 2024

(54) LED MODULE AND DISPLAY DEVICE HAVING LED MODULE

(71) Applicant: Japan Display Inc., Tokyo (JP)

(72) Inventor: Hideaki Abe, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 434 days.

(21) Appl. No.: 17/570,398

(22) Filed: Jan. 7, 2022

(65) Prior Publication Data

US 2022/0131061 A1    Apr. 28, 2022

Related U.S. Application Data

(63) Continuation of application No. PCT/JP2020/021205, filed on May 28, 2020.

(30) Foreign Application Priority Data

Jul. 12, 2019 (JP) ................................ 2019-130140

(51) Int. Cl.
*H01L 33/38* (2010.01)
*H01L 25/075* (2006.01)
*H01L 33/62* (2010.01)

(52) U.S. Cl.
CPC .......... *H01L 33/62* (2013.01); *H01L 25/0753* (2013.01); *H01L 33/387* (2013.01)

(58) Field of Classification Search
CPC ......... H01L 33/36; H01L 33/38; H01L 33/44; H01L 33/62; H01L 33/387; H01L 25/075; H01L 25/0753; H01L 27/15; H01L 27/153; H01L 2933/0066; H01L 33/00; H01L 33/48; H01L 33/50; H01L 33/54; H01L 33/56; H01L 33/60; H01L 33/005
USPC .......................................................... 257/79
See application file for complete search history.

(56) References Cited

U.S. PATENT DOCUMENTS

| 2016/0357056 | A1* | 12/2016 | Kang ................. H01L 27/1248 |
| 2018/0145236 | A1  | 5/2018  | Huang et al. |
| 2021/0050336 | A1* | 2/2021  | Koo ....................... H01L 24/73 |
| 2021/0125973 | A1* | 4/2021  | Kao ...................... H01L 25/167 |

OTHER PUBLICATIONS

International Search Report and Written Opinion mailed on Aug. 25, 2020, received for PCT Application PCT/JP2020/021205, Filed on May 28, 2020, 8 pages including English Translation.

* cited by examiner

*Primary Examiner* — Chuong A Luu
(74) *Attorney, Agent, or Firm* — XSENSUS LLP

(57) ABSTRACT

An LED module includes a first protrusion and a second protrusion adjacent to the first protrusion arranged on an insulating surface, a first electrode arranged on the first protrusion, and a second electrode arranged on the second protrusion, and an LED chip arranged on upper sides of the first protrusion and the second protrusion. The LED chip is connected to the first electrode and the second electrode via conductive members, and the first protrusion and the second protrusion are insulative and have a height of 1 μm to 50 μm.

19 Claims, 19 Drawing Sheets

LED MODULE AND DISPLAY DEVICE HAVING LED MODULE

CROSS-REFERENCE TO RELATED APPLICATIONS

This application is a Continuation of International Patent Application No. PCT/JP2020/021205, filed on May 28, 2020, which claims priority to Japanese Patent Application No. 2019-130140, filed on Jul. 12, 2019, the disclosures of each are incorporated herein by reference for all purposes as if fully set forth herein.

FIELD

An embodiment of the present invention relates to a structure of an LED module in which light-emitting diodes (LEDs) are bare-chip mounted. An embodiment of the present invention relates to a structure of a display device in which pixels are configured by light emitting diodes.

BACKGROUND

A micro LED display is known in which a microscopic light emitting diode called a micro LED is mounted on pixels arranged in a matrix. The micro LED display is common to organic EL displays using organic electroluminescent devices in that pixels are self-emitting. However, while the organic EL display is directly formed with the organic electroluminescent device on a substrate called a backplane on which a thin film transistor (TFT) is arranged, the micro LED display differs in that the micro LED chips are fabricated on a sapphire substrate, and then individualized and mounted to a substrate called the backplane.

The micro LEDs are mounted face down on the backplane in a micro LED display. The micro LED is mounted on the substrate using a flowable conductive paste or solder paste before curing. In this case, it is necessary to precisely control the feed position and feed amount of the conductive paste or solder paste.

SUMMARY

An LED module in an embodiment according to the present invention includes a first protrusion and a second protrusion adjacent to the first protrusion arranged on an insulating surface, a first electrode arranged on the first protrusion, and a second electrode arranged on the second protrusion, and an LED chip arranged on upper sides of the first protrusion and the second protrusion. The LED chip is connected to the first electrode and the second electrode via conductive members, and the first protrusion and the second protrusion are insulative and have a height of 1 μm to 50 μm.

A display device in an embodiment according to the present invention includes a first protrusion and a second protrusion adjacent to the first protrusion arranged in a region where pixels of an insulating surface are arranged, a first electrode arranged on the first protrusion, and a second electrode arranged on the second protrusion, and an LED chip arranged on upper sides of the first protrusion and the second protrusion. The LED chip is connected to the first electrode and the second electrode via conductive members, and the first protrusion and the second protrusion are insulative and have a height of 1 μm to 50 μm.

DESCRIPTION OF EMBODIMENTS

Figure 1A:
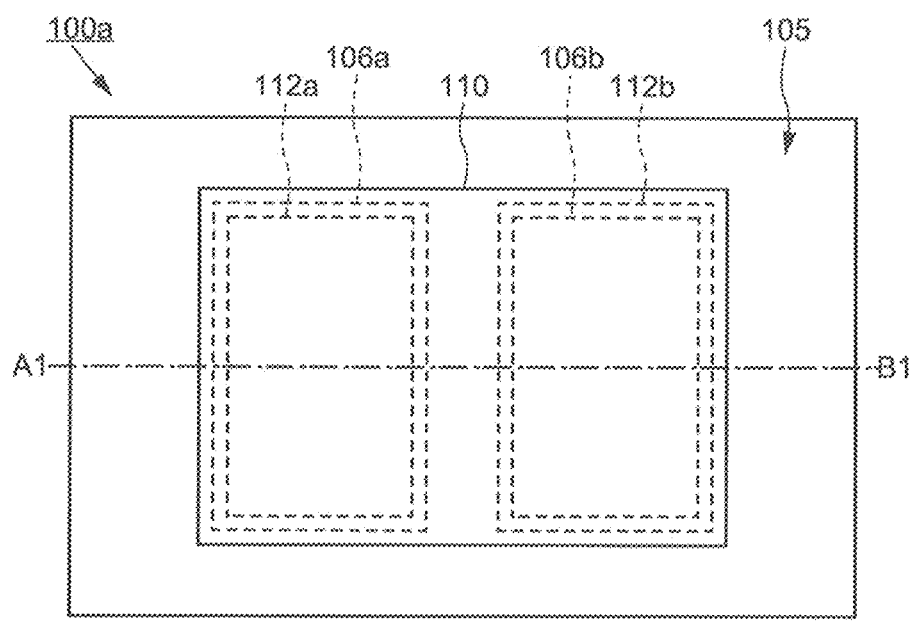
FIG. 1A shows a plan view of an LED module according to an embodiment of the present invention.

Hereinafter, embodiments of the present invention will be described with reference to the drawings and the like. The present invention may be carried out in various forms without departing from the gist of the invention thereof, and is not to be construed as being limited to any of the following embodiments. Although the drawings may schematically represent the width, thickness, shape, and the like of each part in comparison with the actual embodiment in order to clarify the description, they are merely examples and do not limit the interpretation of the present invention. In the present specification and each of the figures, elements similar to those described previously with respect to the figures already mentioned are designated by the same reference numerals (or numbers followed by a, b, etc.), and a detailed description thereof may be omitted as appropriate. Furthermore, the characters "first" and "second" appended to each element are convenient signs used to distinguish each element, and have no further meaning unless specifically described.

As used herein, where a member or region is "on" (or "below") another member or region, this includes cases where it is not only directly on (or just under) the other member or region but also above (or below) the other member or region, unless otherwise specified. That is, it includes the case where another component is included in between above (or below) other members or regions. In the following description, unless otherwise specified, it is assumed that the LED chips are "on" or "above" the substrate when the substrate is used as a reference and that the substrate is "under" or "below" the LED chips when the LED chips are used as a reference.

In the present invention, a micro LED refers to a chip having a chip size of not less than a few micrometers and not more than 100 micrometers, and a mini LED refers to a chip having a chip size of not less than 100 micrometers. In an embodiment of the present invention, LEDs of any size can be used according to the pixel size of the LED module and display device.

First Embodiment

Figure 1B:
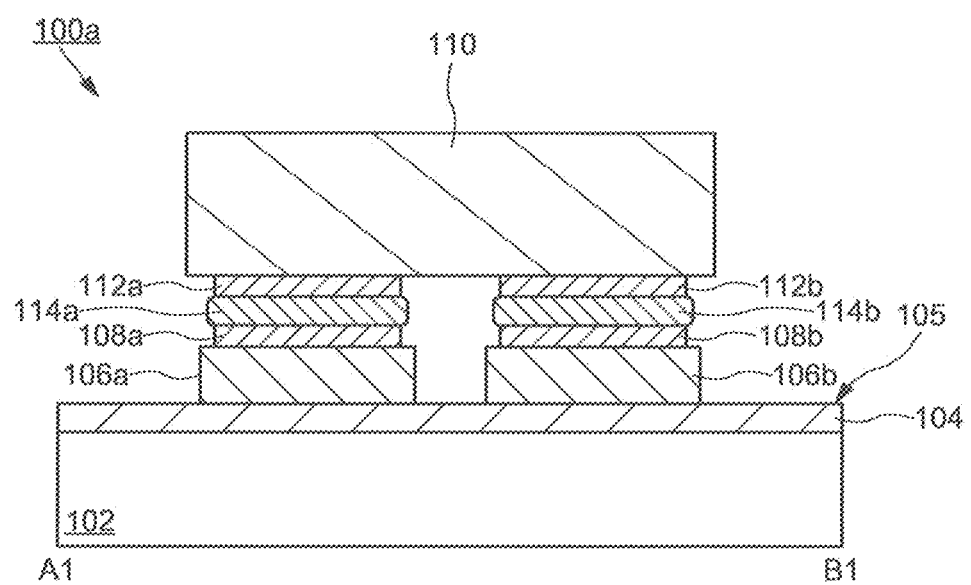
FIG. 1B shows a cross-sectional view of an LED module according to an embodiment of the present invention.

A structure of the LED module 100a according to an embodiment of the present invention is shown in FIG. 1A and FIG. 1B. FIG. 1A shows a schematic top view of the LED module 100a and FIG. 1B shows a schematic cross-sectional view corresponding to the line A1-A2.

The LED module 100a has a structure in which the LED chip 110 is mounted on a first protrusion 106a and a second protrusion 106b arranged on an insulating surface 105. The insulating surface 105 may be formed by an insulating substrate or may be formed by a first insulating layer 104 disposed on the substrate 102. Although not shown in FIG. 1A and FIG. 1B, wrings may be arranged on the substrate 102 that are connected to the LED chip 110, or a circuit that controls the emission of the LED chip 110 may be formed by thin film transistors.

The insulating surface 105 has a generally flat surface. The first protrusion 106a and the second protrusion 106b are arranged to project from the substantially flat insulating surface 105. The first protrusion 106a and the second protrusion 106b are formed of insulating materials. For example, the first protrusion 106a and the second protrusion 106b are formed using a resinous material such as polyimide, acrylic, or an inorganic insulating material such as silicon oxide. The first protrusion 106a and the second protrusion 106b may also be formed by a core portion formed of a metallic material and an insulating film covering the surface of the core portion.

The first protrusion 106a and the second protrusion 106b are spaced apart on the insulating surface 105. It is to be noted that the first protrusion 106a and the second protrusion 106b are not necessarily distinguished as two regions which are clearly separated from each other. As shown in FIG. 1A and FIG. 1B, it is preferred that the spaces between the first protrusion 106a and the second protrusion 106b are separated so that an air gap is formed in the area at least overlapping the LED chip 110. The first protrusion 106a and the second protrusion 106b are arranged to have a spacing consistent with a pair of electrode spaces provided with the LED chip 110, as will be explained below.

The first protrusion 106a and the second protrusion 106b have a three-dimensional shape and have a frustoconical shape with a flat top surface such as a truncated pyramid or a truncated cone. The height of the first protrusion 106a and the second protrusion 106b from the insulating surface 105 to the upper surface is preferably such that conductive members are separated between the upper surface of the protrusion and the insulating surface when conductive members are disposed on the first protrusion 106a and the second protrusion 106b. In order to achieve such a condition, the height of the first protrusion 106a and the second protrusion 106b are preferably 1 μm to 50 μm, and preferably 5 μm to 10 μm, for example.

The height of the first protrusion 106a and the second protrusion 106b may be the same or different. In other words, when the LED chip 110 is located above the first protrusion 106a and the second protrusion 106b, the height is preferably adjusted to be horizontal.

The top surface of the first protrusion 106a is arranged with a first electrode 108a and the top surface of the second protrusion 106b is arranged with a second electrode 108b. The first electrode 108a and the second electrode 108b are located higher than the insulating surface 105 by being disposed on the first protrusion 106a and the second protrusion 106b, respectively. The first electrode 108a and the second electrode 108b are separated by a space between the first protrusion 106a and the second protrusion 106b. The material for forming the first electrode 108a and the second electrode 108b is not limited, but a conductive material having fluidity during application or dropping and a material having good wetting properties are selected. The first electrode 108a and the second electrode 108b are formed of a conductive material such as, for example, gold (Au), copper (Cu), silver (Ag), tin (Sn) or aluminum (Al).

The LED chip 110 is a two-terminal device and has a first pad electrode 112a and a second pad electrode 112b for so-called flip-chip mounting. For example, the LED chip 110 includes the first pad electrode 112a and the second pad electrode 112b on a side facing the first electrode 108a and the second electrode 108b. The first pad electrode 112a and the second pad electrode 112b are electrodes for emitting light from the LED chip 110 by a bias voltage, one is called an n-side electrode and the other called a p-side electrode. The first pad electrode 112a and the second pad electrode 112b are preferably formed of a metal material and have a metal surface such as gold (Au) or silver (Ag).

The LED chip 110 is mounted over the first protrusion 106a and the second protrusion 106b by a first conductive member 114a and a second conductive member 114b. The first conductive member 114a is disposed between the first pad electrode 112a and the first electrode 108a, and the second conductive member 114b is disposed between the second pad electrode 112b and the second electrode 108b. The first conductive member 114a and the second conductive member 114b are disposed separately from each other so that the first pad electrode 112a and the second pad electrode 112b are not short-circuited.

The first conductive member 114a and the second conductive member 114b are made of a conductive paste. As the conductive paste, a silver paste, a carbon paste, or a paste having silver and carbon mixed therewith is used. A solder paste may also be used as the first conductive member 114a and the second conductive member 114b. The conductive paste is fluidic and cures by dropping onto the object and then baking or merely drying. The conductive paste must be dropped accurately onto each of the first electrode 108a and the second electrode 108b. When the amount conductive paste which is dropped is too large, the paste spreads and causes a short circuit between the electrodes. On the other hand, when the amount of conductive paste which is dropped is too small, the electrical continuity is defective, and the force (adhesive force) that fixes the LED chip 110 decreases, causing the LED chip to peel off.

After the conductive paste or solder paste is disposed by dropping to the first electrode 108a and the second electrode 108b, the LED chip 110 is arranged on the first electrode 108a and the second electrode 108b, and the conductive paste is pressed and spreads laterally. In this step, when the amount of conductive paste or solder paste which his dropped is too large, the spread of the conductive paste or solder paste may increase, causing the first pad electrode 112a to short circuit the second pad electrode 112b. For this reason, precise control of the amount of the conductive paste or solder paste dropped is required. However, since the size of the LED chip 110 is small, it is difficult to control the amount of the conductive paste, or the solder paste which is dropped.

Figure 2:
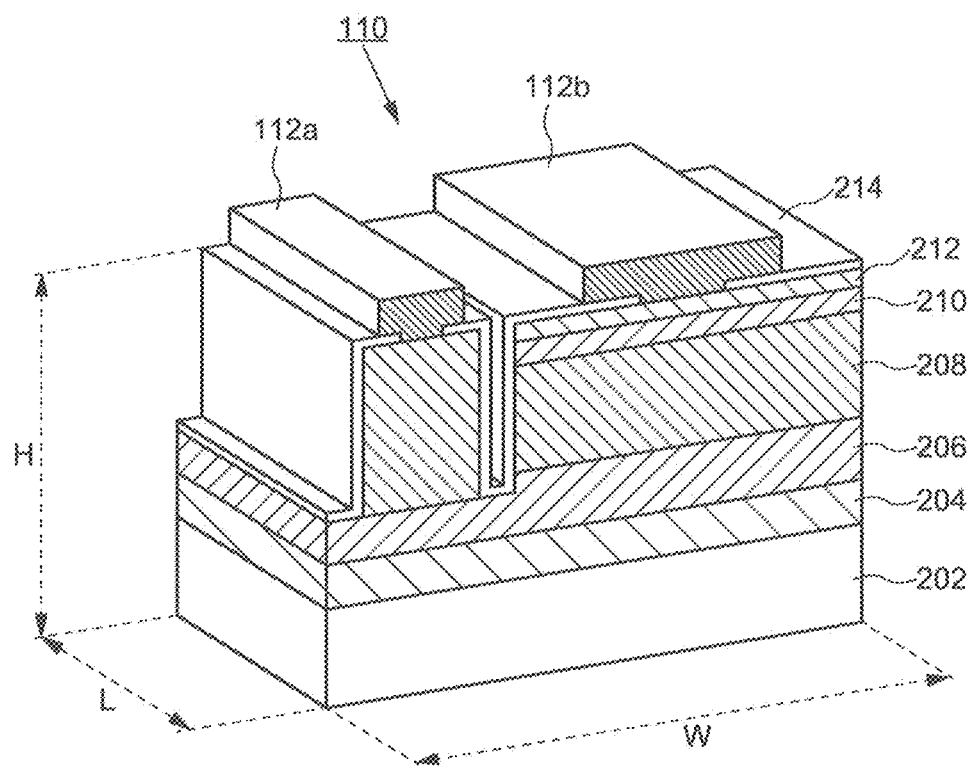
FIG. 2 shows a perspective view illustrating the structure of an LED chip.

FIG. 2 shows an example of the structure of the LED chip 110. The LED chip 110 has a structure comprising a buffer layer 204 formed of gallium nitride or the like on a substrate 202 formed of a semiconductor wafer such as GaAs or an insulating material such as sapphire, an n-type layer 206 formed of a gallium nitride-based compound semiconductor, an active layer 208 in which a quantum well structure is formed of a gallium nitride-based compound semiconductor, a p-type layer 210 formed of a gallium nitride-based compound semiconductor, a passivation layer 214, a first chip electrode 112a, and a second chip electrode 112b. The size of the LED chip 110 is referred to as a so-called micro LED having a length L of 10 μm to 20 μm, a width W of 20 μm to 40 μm, and a height H of about 150 μm. Therefore, the distance between the first chip electrode 112a and the second chip electrode 112b is 10 μm or less. Note that the size of the LED chip 110 is not limited to the micro LED as explained above, and may be a size of a so-called mini LED.

For such microstructures, the LED module 100a according to the present embodiment has a structure that prevents short circuits between the electrodes by arranging the first electrode 108a and the second electrode 108b contacting the LED chip 110 on protrusions 106 (first protrusion 106a, second protrusion 106b) that are divided into two regions in a cross-sectional view. That is, the LED module 100 has a structure in which the first electrode 108a and the second electrode 108b are not arranged side by side on the flat insulating surface 105, but a step portion is interposed between both electrodes, so that the first conductive member 114a and the second conductive member 114b are not easily short-circuited even when the first conductive member 114a and the second conductive member 114b are laterally extended.

Figure 3A:
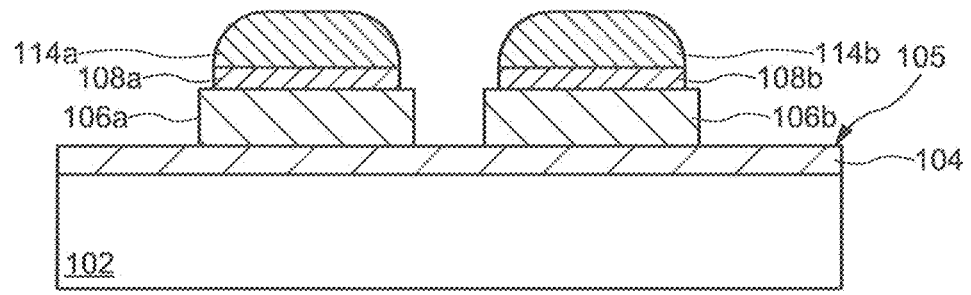
FIG. 3A shows the structure of an LED module according to an embodiment of the present invention in which an electrically conductive member is dropped onto an electrode disposed on a protrusion.
Figure 3B:
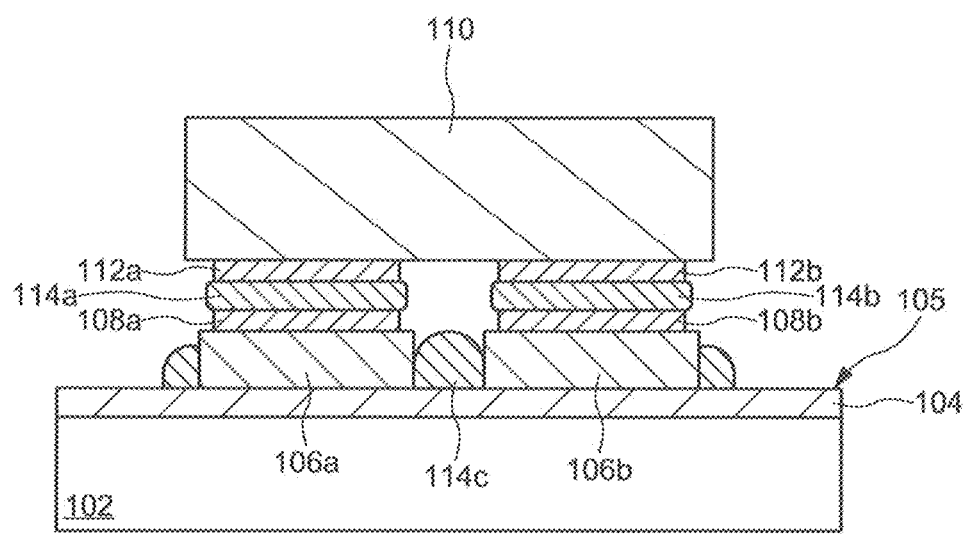
FIG. 3B shows the structure of an LED module according to an embodiment of the present invention in which an LED chip is mounted on electrodes dropped with a conductive member.

FIG. 3A shows a state in which the first conductive member 114a and the second conductive member 114b are dropped over the first electrode 108a and the second electrode 108b. The first conductive member 114a and the second conductive member 114b have fluidity and are disposed on the first electrode 108a and the second electrode 108b with a predetermined thickness. As shown in FIG. 3B, when the LED chip 110 is mounted on the first electrode 108a and the second electrode 108b in this state, the first conductive member 114a and the second conductive member 114b are widened in the lateral direction as much as the thickness by which the first conductive member 114a and the second conductive member 114b are reduced by being pressed by the LED chip 110. The LED module 110a has the step portion formed by the first protrusion 106a and the second protrusion 106b. According to this structure, it is possible to prevent the flowing conductive member 114c being separated from the first conductive member 114a and the second conductive member 114b by the step formed by the protrusions, so that the first electrode 108a and the second electrode 108b are not electrically connected.

Figure 4A:
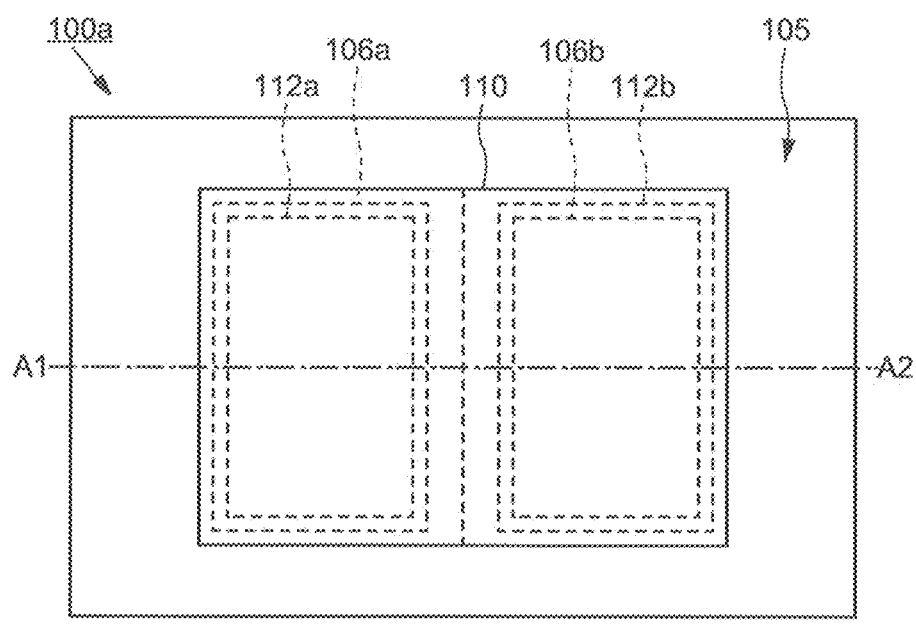
FIG. 4A shows a plan view of an LED module according to an embodiment of the present invention.
Figure 4B:
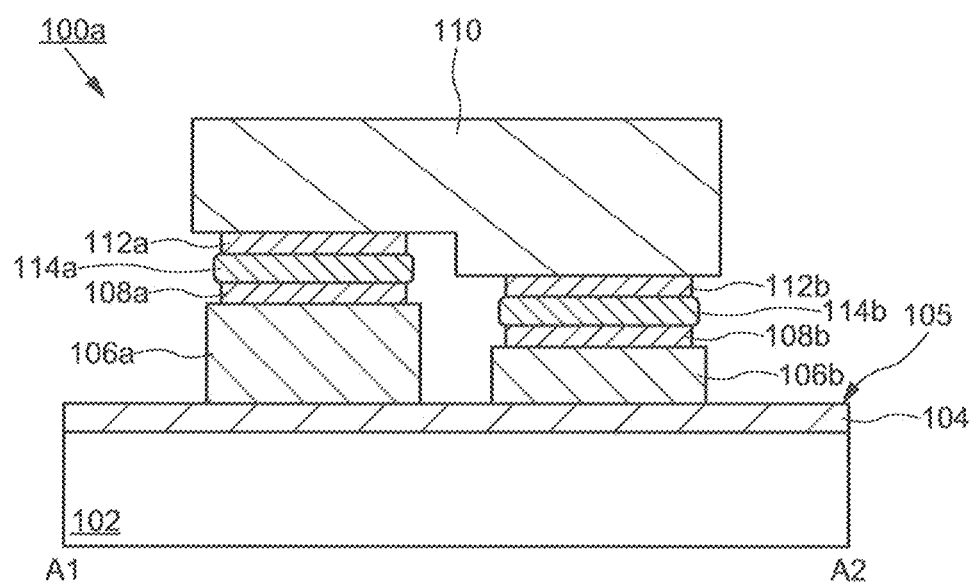
FIG. 4B shows a cross-sectional view of an LED module according to an embodiment of the present invention.

The height of the first protrusion 106a and the second protrusion 106b may be suitably adjusted to the shape of the LED chip 110. For example, as shown in FIGS. 4A and 4B, it is possible to make the height of the first protrusion 106a larger than the height of the second protrusion 106b when the heights of the first pad electrode 112a and the second pad electrode 112b are different in the LED chip 110. The structure in which the heights of the two protrusions are different makes it possible to mount the LED chip 110 horizontally and to prevent a short circuit between the electrodes.

According to the present embodiment, it is possible to prevent a short circuit between the electrodes by arranging the protrusions 106 (first protrusions 106a and second protrusions 106b) on the surface of the LED chip 110 and bonding the LED chip 110 to the surface by using the conductive members 114 (first conductive members 114a and second conductive members 114b). As a result, it is possible to prevent the generation of short-circuit defects in the LED module 100a and to improve yield during manufacturing. Also, even when the conductive members 114 (first conductive member 114a, second conductive member 114b) are migrated after manufacturing the LED module 100a, the step portion is formed by the protrusions 106 (first protrusion 106a, second protrusion 106b) to prevent the generation of short circuit defects in the LED chip 110. Further, even when the conductive members 114 (first conductive member 114a and second conductive member 114b) migrate after the manufacturing of the LED module 100a, the step portion is formed by the protrusions 106 (first protrusions 106a and second protrusions 106b), whereby it is possible to prevent the generation of short-circuit defects in the LED chip 110.

Second Embodiment

This embodiment shows that the structure of the protrusion is different from that of the LED module shown in the first embodiment. The following explanation discusses parts that differ from the first embodiment.

Figure 5A:
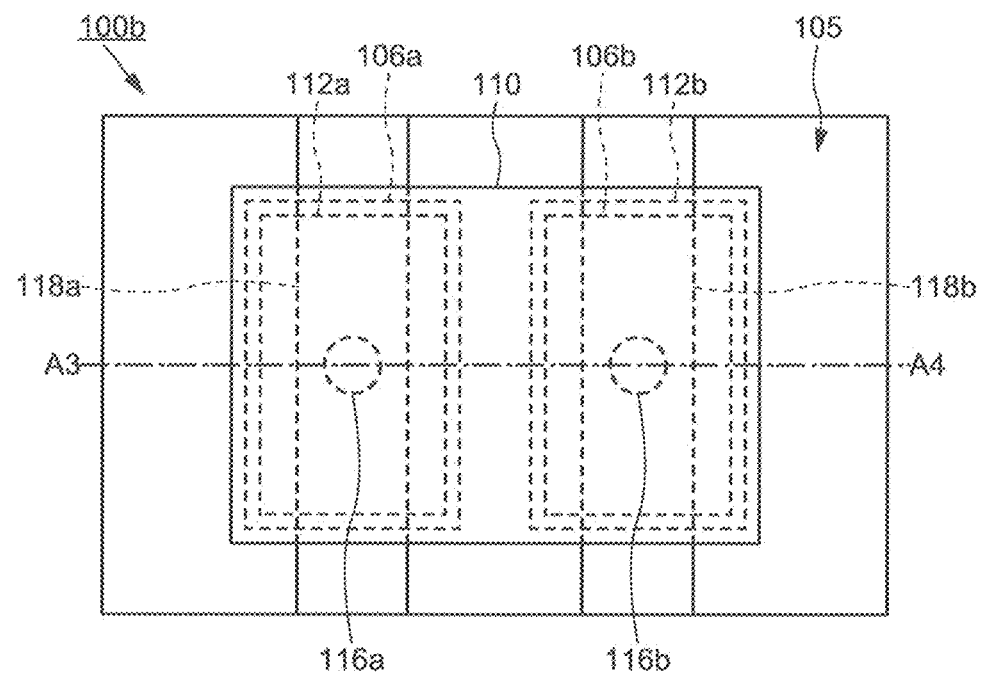
FIG. 5A shows a plan view of an LED module according to an embodiment of the present invention.
Figure 5B:
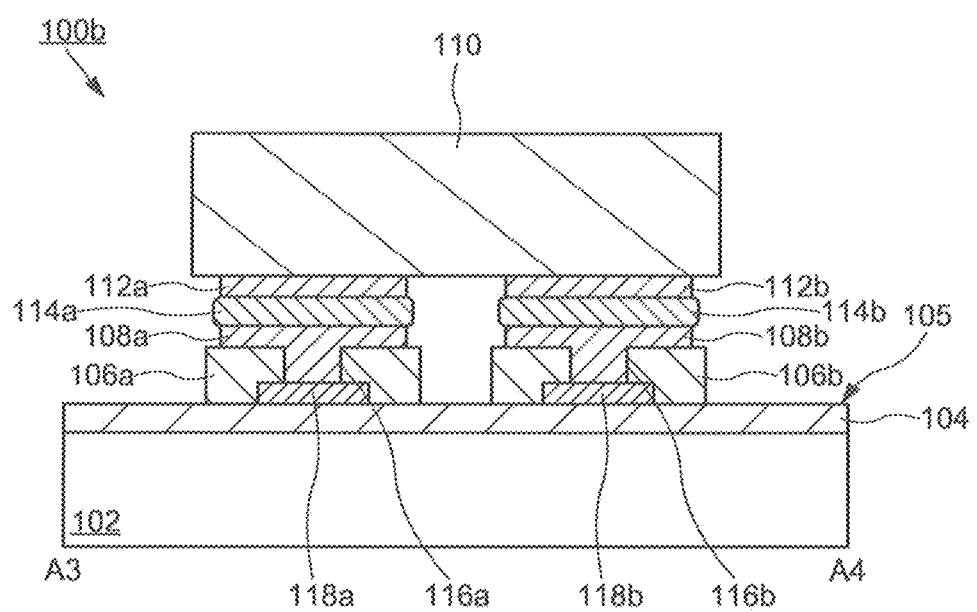
FIG. 5B shows a cross-sectional view of an LED module according to an embodiment of the present invention.

FIG. 5A and FIG. 5B show an LED module 100b according to this embodiment. FIG. 5A shows a top view of the LED module 100b and FIG. 5B shows a cross-sectional view along the line A3-A4. In this embodiment, the protrusions 106 have through holes 116. The through holes 116 are provided to pass through the lower surface from the upper surface of the protrusions 106. Specifically, a first through hole 116a is provided in the first protrusion 106a, and a second through hole 116b is provided in the second protrusion 106b. The first electrode 108a is disposed to overlap with the first through hole 116a and the second electrode 108b is disposed to overlap with the second through hole 116b.

The electrodes arranged on the protrusions are connected to a circuit provided on the substrate by the through holes. For example, as shown in FIG. 5A and FIG. 5B, the first protrusion 106a is arranged to overlap a first wiring 118a and the second protrusion 106b is arranged to overlap a second wiring 118b. The first electrode 108a is connected to the first wiring 118a via the first through hole 116a, and the second electrode 108b is connected to the second wiring 118b via the second through hole 116b.

The through holes provided in the protrusions make it possible to connect the wirings or electrodes provided on the lower side of the protrusions to the electrodes arranged on the upper surfaces of the protrusions. In this embodiment, since the step portion is provided between the first electrode 108a and the second electrode 108b by the first protrusion 106a and the second protrusion 106b as in the first embodiment, it is possible to prevent the generation of short-circuits between the electrodes of the LED chip 110.

Third Embodiment

This embodiment shows a different aspect of the structure of the electrodes provided in the protrusion with respect to the LED modules shown in the first embodiment. The following description discusses parts that differ from the first embodiment.

Figure 6A:
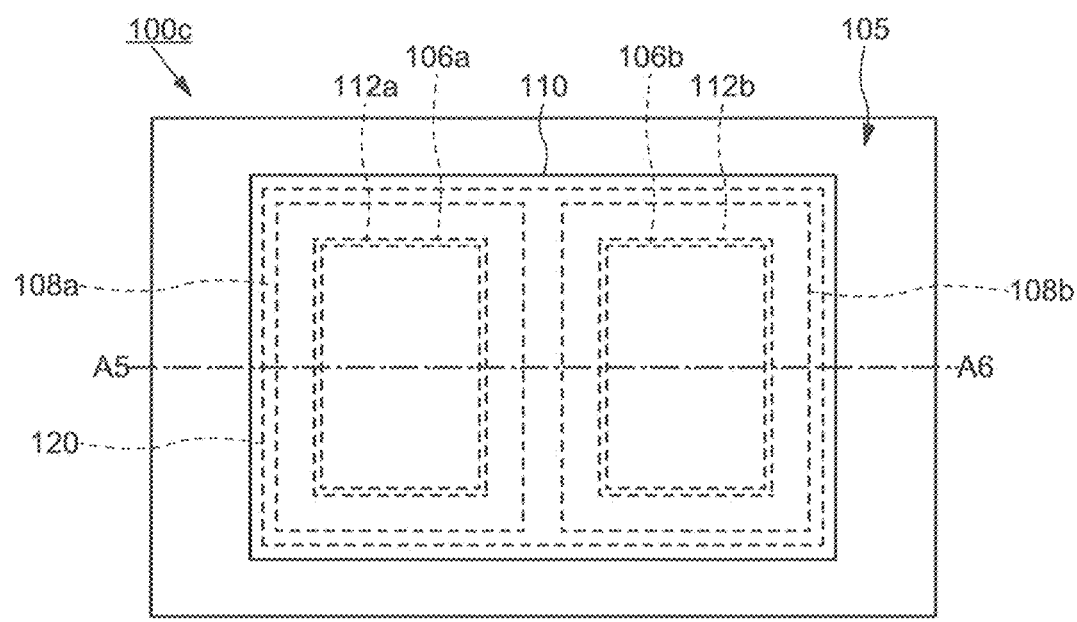
FIG. 6A shows a plan view of an LED module according to an embodiment of the present invention.
Figure 6B:
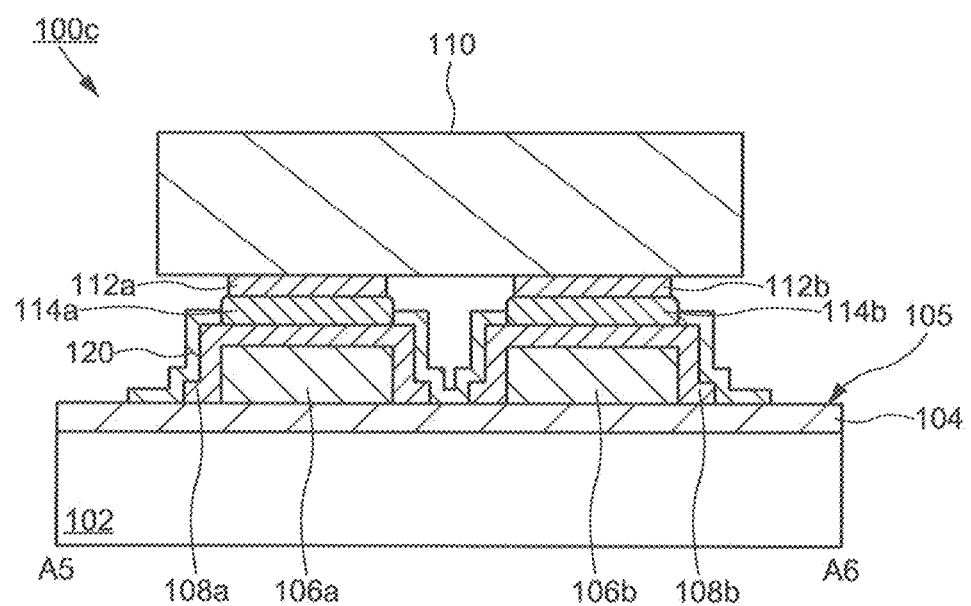
FIG. 6B shows a cross-sectional view of an LED module according to an embodiment of the present invention.

FIG. 6A and FIG. 6B show an LED module 100c according to this embodiment. FIG. 6A shows a top view of the LED module 100c and FIG. 6B shows a cross-sectional view along line A5-A6. In this embodiment, the first electrode 108a is arranged on the top surface and side surface of the first protrusion 106a, and the second electrode 108b is arranged on the top surface and side surface of the second protrusion 106b. In other words, the LED module 100c has a structure in which the first protruding portion 106a is arranged to overlap the first electrode 108a so that a part of the first electrode 108a protrudes, and the second protruding portion 106b is arranged to overlap the second electrode 108b so that a part of the second electrode 108b protrudes.

It is possible to sufficiently secure the electrode width required for mounting the LED chip 110 by arranging the first electrode 108a and the second electrode 108b not only on the upper surfaces of the first protrusion 106a and the second protrusion 106b but also on the side surfaces of the first protrusion 106a and the second protrusion 106b. A protective insulating layer 120 may dispose to expose the upper surfaces of the first electrode 108a and the second electrode 108b and to cover the side surfaces of the first electrode 108a and the second electrode 108b. When the protective insulating layer 120 is provided, it is possible to reliably insulate the first electrode 108a and the second electrode 108b.

The LED chip 110 is arranged on a portion where the first electrode 108a protrudes by the first protrusion 106a and a portion where the second electrode 108b protrudes by the second protrusion 106b. The first conductive member 114a is disposed in the protruding portion of the first electrode 108a and the second conductive member 114b is disposed in the protruding portion of the second electrode 108b. Also in this embodiment, since the conductive member 114a and the conductive member 114b are disposed so as to interpose the stepped portion formed by the first protruding portion 106a and the second protruding portion 106b, the LED module 110c has a structure capable of preventing the conductive member 114a and the conductive member 114b from coming into contact with each other and conducting.

Figure 7A:
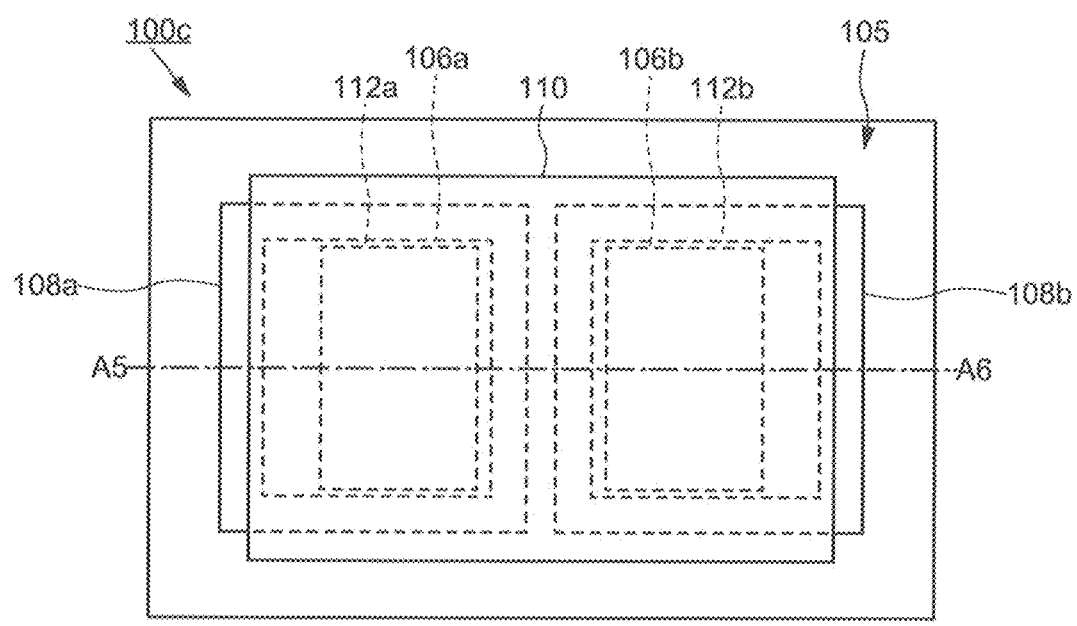
FIG. 7A shows a plan view of an LED module according to an embodiment of the present invention.
Figure 7B:
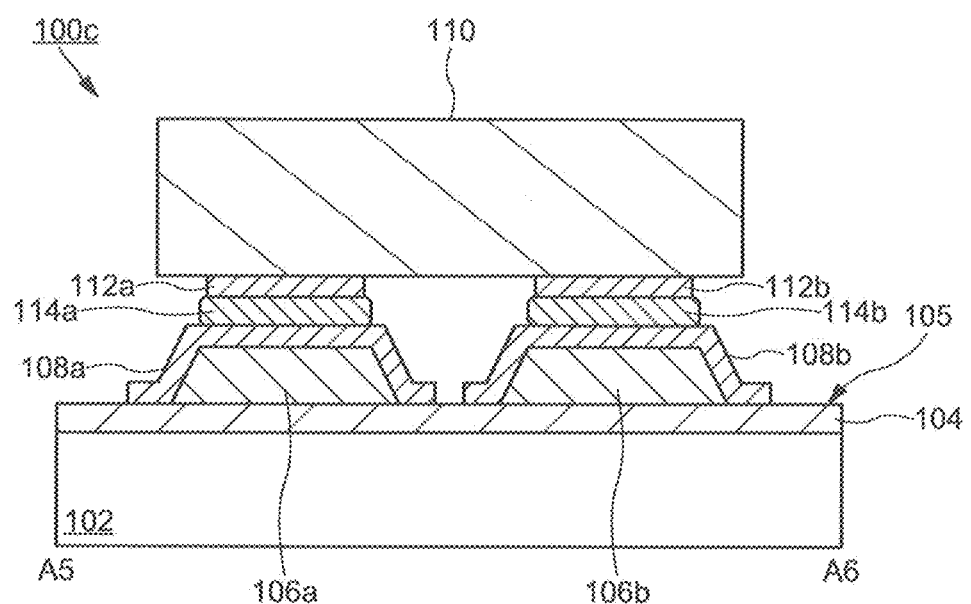
FIG. 7B shows a cross-sectional view of an LED module according to an embodiment of the present invention.

The side surfaces of the first protrusion 106a and the second protrusion 106b may be inclined. As shown in the plan view of FIG. 7A and in the cross-sectional view of FIG. 7B, since the cross-sectional structure of the first protrusion 106a and the second protrusion 106b has a trapezoidal shape, it is possible to arrange the first electrode 108a and the second electrode 108b so as not to be disconnected by step in the stepped portion.

According to any of the embodiments shown in FIG. 6A, FIG. 6B, FIG. 7A, and FIG. 7B, the first conductive member 114a is disposed on the upper surface of the protrusion formed on the first electrode 108a, and the second conductive member 114b is disposed on the upper surface of the protrusion formed on the second electrode 108b. As a result, a step portion is interposed between the first conductive member 114a and the second conductive member 114b. This prevents shorting between the electrodes when the LED chip 110 is mounted.

In addition, it is possible to appropriately combine the configuration shown in the second embodiment with the configuration shown in the present embodiment. That is, for the structures of the electrodes overlying the protrusion, a through hole may be provided in the protrusion. It may also have a structure that connects the wiring on the lower layer by means of through-holes.

Fourth Embodiment

This embodiment shows an embodiment in which a third protrusion is arranged in the LED module shown in the third embodiment. The following description explains parts that differ from the third embodiment.

Figure 8A:
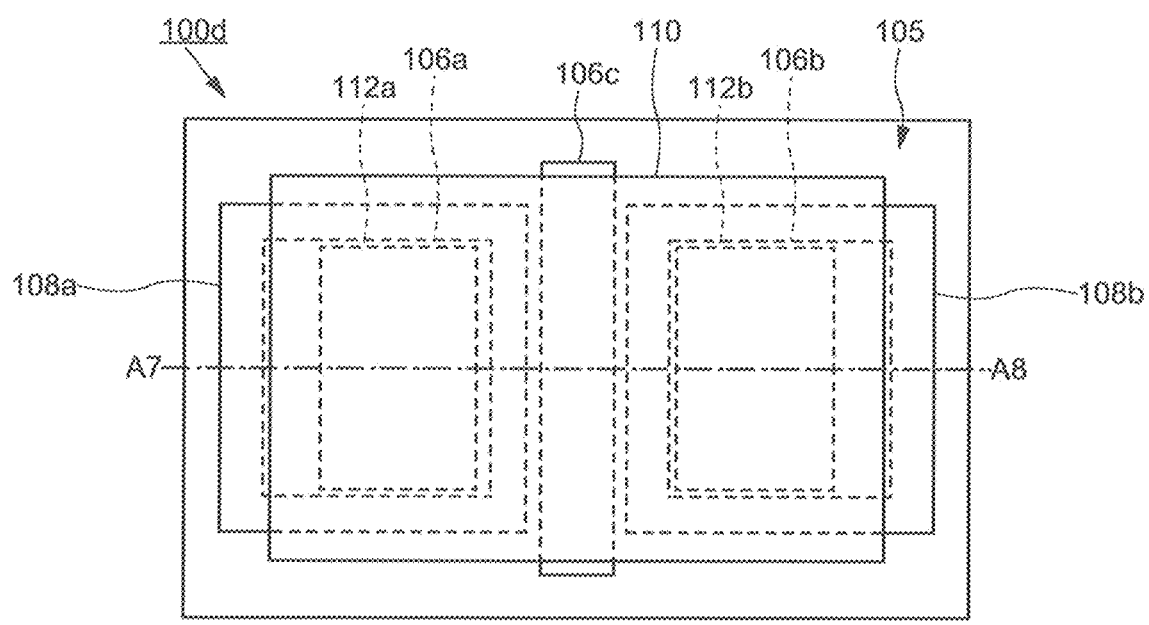
FIG. 8A shows a plan view of an LED module according to an embodiment of the present invention.
Figure 8B:
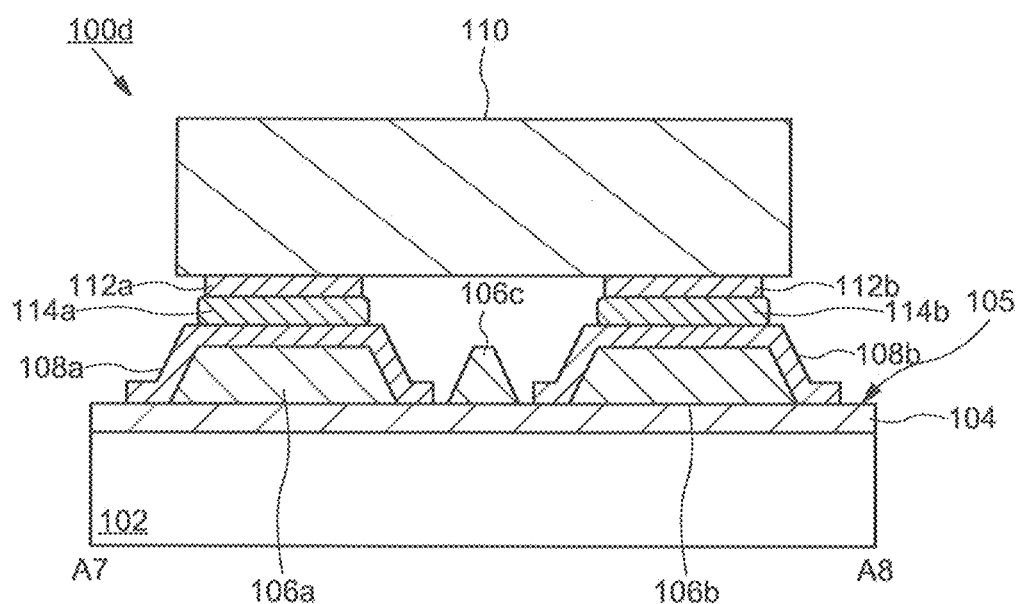
FIG. 8B shows a cross-sectional view of an LED module according to an embodiment of the present invention.

FIG. 8A and FIG. 8B show an LED module 100d according to this embodiment. FIG. 8A shows a top view of the LED module 100d and FIG. 8B shows a cross-sectional view along the line A7-A8.

As shown in FIG. 8A and FIG. 8B, a third protrusion 106c is arranged between the first protrusion 106a and the second protrusion 106b. The third protrusion 106c is arranged to traverse between the first protrusion 106a and the second protrusion 106b. Since the third protrusion 106c has such a structure, it is possible to reliably separate the two electrodes even when the first electrode 108a and the second electrode 108b are arranged along the surfaces of the first protrusion 106a and the second protrusion 106b, respectively. Even if the first conductive member 114a and the second conductive member 114b flow in the lateral direction, it is possible to block the flow to the adjacent electrode by functioning as a blocking wall for preventing the flow of the third protrusion 106c. As a result, it is possible to reliably prevent a short circuit between the first electrode 108a and the second electrode 108b.

This embodiment may be implemented in combination with the first and second embodiments, as well as with the third embodiment.

Fifth Embodiment

This embodiment shows a display device having the structure of the LED module shown in the first to the fourth embodiment.

Figure 9:
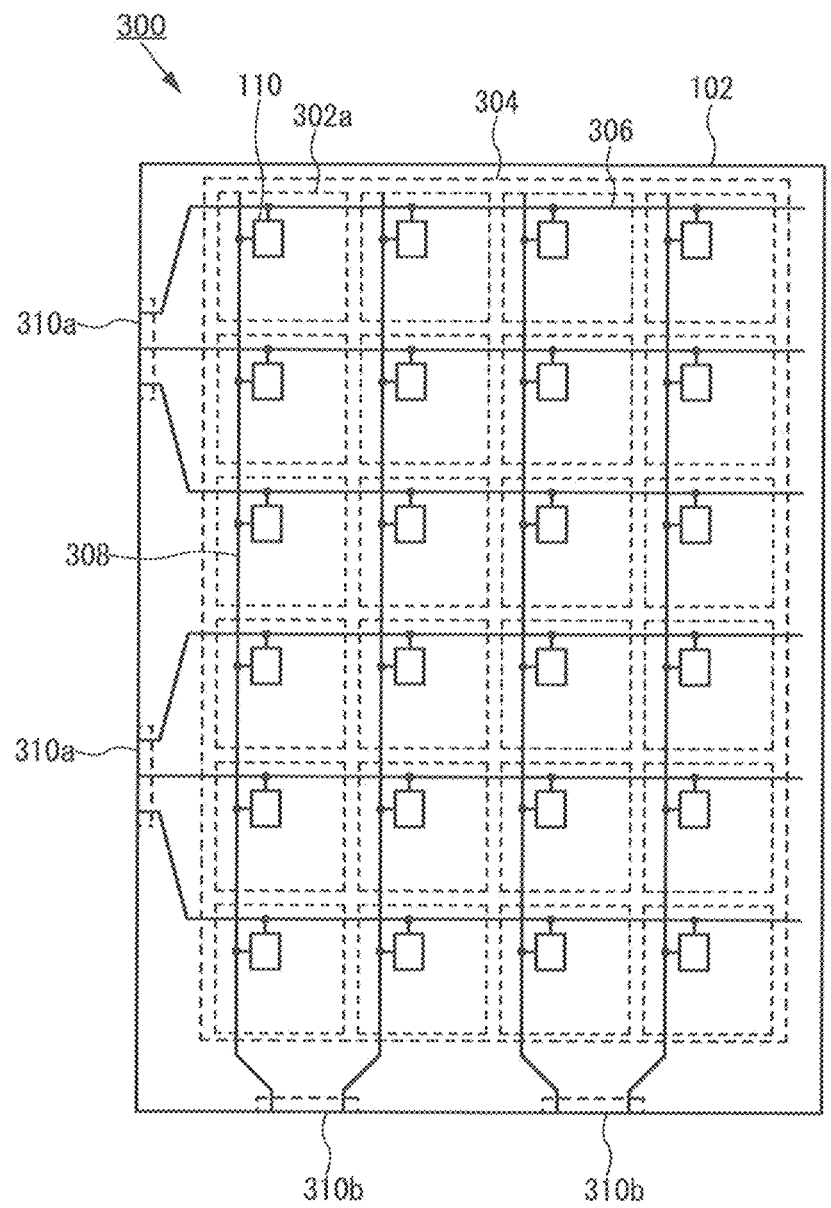
FIG. 9 shows the structure of a display device according to an embodiment of the present invention.

FIG. 9 shows a structure of a display device 300 according to the present embodiment. The display device 300 includes a display part 304 on the substrate 102 with pixels 302 arranged in a matrix. A scanning signal line 306 for inputting a scanning signal to the pixel 302 and a data signal line 308 for inputting a video signal are arranged outside the display part 304. The scanning signal line 306 and the data signal line 308 are arranged to intersect. A peripheral part of the substrate 102 is arranged with an input terminal 310a of the scanning signal line 306 and an input terminal 310b of the data signal line 308. Although not shown in FIG. 9, a driver IC for driving the pixel 302 may be mounted on the substrate 102.

Figure 10:
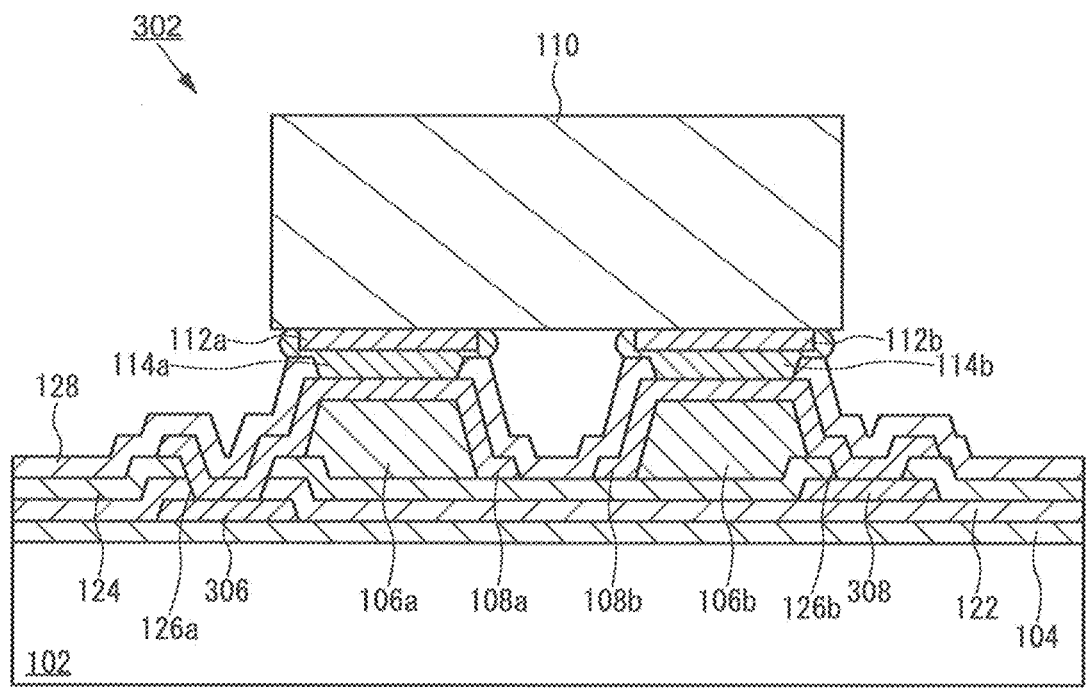
FIG. 10 shows a cross-sectional view of a pixel in a display device according to an embodiment of the present invention.
Figure 11:
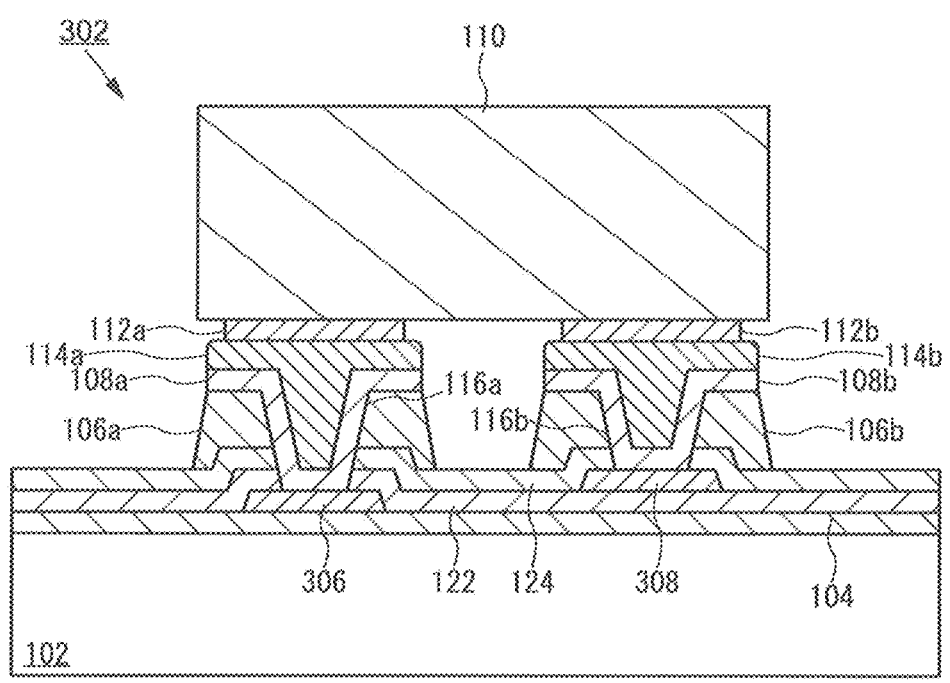
FIG. 11 shows a cross-sectional view of a pixel in a display device according to an embodiment of the present invention.

FIG. 10 shows an example of a cross-sectional structure of the pixel 302a shown in FIG. 9. The pixel 302a has a structure in which the first insulating layer 104, the second insulating layer 122, and the third insulating layer 124 are laminated from the side of the substrate 102 and the first protrusion 106a and the second protrusion 106b are arranged on the insulating surface formed by the third insulating layer 126. The scanning signal line 306 is arranged between the first insulating layer 104 and the second insulating layer 122, and the data signal line 308 is arranged between the second insulating layer 122 and the third insulating layer 124. The second insulating layer 124 is disposed between the scanning signal line 306 and the data signal line 308 so that the two signal lines cross each other on the display part 304.

The first electrode 108a is arranged along a side surface inclined from the upper surface of the first protrusion 106a so as to overlap the contact hole 126a passing through the third insulating layer 124 and the second insulating layer 122, and is connected to the scanning signal line 306. The second electrode 108b is arranged so as to overlap the contact hole 126b passing through the third insulating layer 124 along a side surface inclined from the upper surface of the second protrusion 106b, and is connected to the data signal line 308. A passivation layer 128 may be further disposed on upper sides of the first electrode 108a and the second electrode 108b.

The LED chip 110 is arranged on the first protrusion 106a and the second protrusion 106b. The first pad electrode 112a of the LED chip 110 is connected to the first electrode 108a via the first conductive member 114a, and the second pad electrode 112b is connected to the second electrode 108b via the second conductive member 114b. The LED chip 110 is arranged on the first protrusion 106a and the second protrusion 106b. The display part 304 has a structure that prevents a short circuit between the electrodes of the LED chip 110 even when the first conductive member 114a and the second conductive member 114b flow laterally because a step portion is formed between the first electrode 108a and the second electrode 108b by the first protrusion 106a and the second protrusion 106b. In other words, since the first protrusion 106a and the second protrusion 106b are arranged in the pixel 302, it is possible to provide a margin in the process of dropping the first conductive member 114a and the second conductive member 114b, thereby improving the productivity and the yield of the display device 300.

The scanning signal line 306 may be disposed so as to overlap the first protrusion 106a, and the data signal line 308 may be disposed so as to overlap the second protrusion 106b. In this structure, the first electrode 108a is connected to the scanning signal line 306 via the first through hole 116a arranged in the first protrusion 106a, and the second electrode 108b is connected to the data signal line 308 via a second through hole 116b arranged in the second protrusion 106b.

Although this embodiment showed the structure of the first electrode 108a and the second electrode 108b applied with the structure according to the third embodiment, the present invention is not limited thereto, and the structure according to the first, second, and fourth embodiments may be suitably applied.

Although the present embodiment shows an example in which a passive matrix type pixel is configured by an LED module, the present embodiment is not limited thereto, and the emission of the pixels may also be applied to an active matrix type pixel controlled by a pixel circuit by transistors.

Sixth Embodiment

This embodiment shows a sealing layer and a cover glass being further provided in the pixel structure shown in the fifth embodiment. The following description explains a part that differs from the fourth embodiment.

Figure 12:
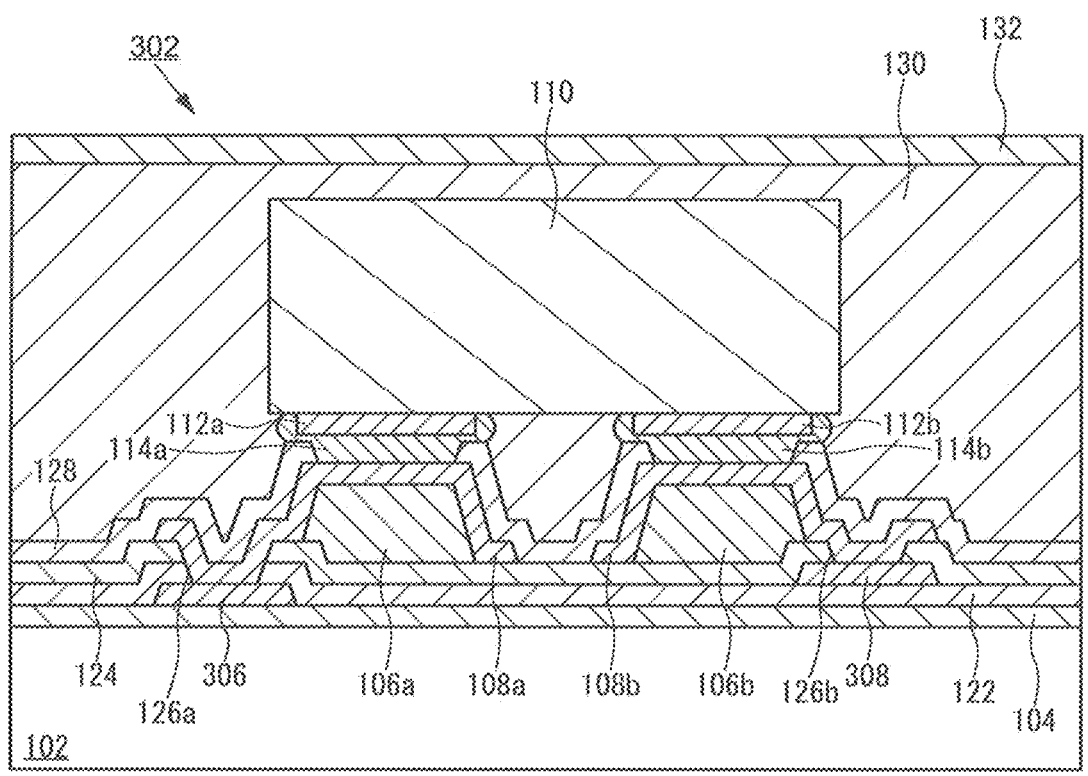
FIG. 12 shows a cross-sectional view of a pixel in a display device according to an embodiment of the present invention.

In this embodiment, the pixel 302 in display part 300 includes a sealing layer 130 and a cover glass 132 as shown in FIG. 12. Other structures are equivalent to those described in the fifth embodiment with reference to FIG. 10. The sealing layer 130 has a function as a protective film for the LED chip 110, a function as an adhesive layer for laminating the sealing layer to the cover glass, and a function as a planarizing layer for planarizing a step produced by the LED chip 110 when the cover glass 132 is laminated.

The sealing layer 130 is formed, for example, of a resin such as acrylic, and is bonded after mounting the LED chip 110, for example, by applying a slit coating method, followed by applying a cover glass and applying an ultraviolet cure. When the sealing layer 130 is formed, if the protrusions 106 (106a, 106b) according to one embodiment of the present invention are not arranged, it is considered that the gap between the lower surface (substrate 102 side) of the LED chip 110 and the insulating surface 105 (the surface of the passivation layer 128 which is the top insulating film in FIG. 12) immediately below the LED chip 110 and the LED chip 110 becomes small. When the gap is small, there is a problem that the flowable composition forming the sealing layer 130 does not flow into the gap. There is also a problem in that bubbles remain in the gap. If the bubbles remain directly under the LED chip 110, light emitted from the LED chip 110 toward the insulating surface 105 is diffusely reflected, and there is a concern that the display performance may be degraded. Further, there is a problem that bubbles move in the sealing layer 130 and cause irregular reflection in an undesired place.

On the other hand, the pixel 302 according to the present exemplary embodiment has the protrusions 106 (first protrusion 106a, second protrusion 106b) so that the gap between the LED chip 110 directly beneath and the insulating surface 105 can be enlarged to facilitate the flow of the flowable composition forming the sealing layer 130, in addition to preventing short circuits due to the flow of the conductive member 114, thereby preventing the generation of air bubbles as described above. Thus, it is possible to prevent deterioration of display performance in the display device. The configuration of the sealing layer 130 and the cover glass 132 shown in this embodiment may be implemented by appropriately combining the structures shown in the first to fourth embodiments.

What is claimed is:

1. An LED module, comprising:
    a first protrusion and a second protrusion adjacent to the first protrusion arranged on an insulating surface;
    a first electrode arranged on the first protrusion, and a second electrode arranged on the second protrusion; and
    an LED chip arranged on an upper sides of the first protrusion and the second protrusion, wherein
    the LED chip is connected to the first electrode and the second electrode via conductive members,
    the first protrusion and the second protrusion are insulative and have a height of 1 μm to 50 μm,
    the first protrusion has a first through hole passing through a bottom surface from an upper surface, and the second protrusion has a second through hole passing through a bottom surface from an upper surface, and
    the first electrode is arranged to overlap the first through hole, and the second electrode is arranged to overlap the second through hole.

2. The LED module according to claim 1, wherein the LED chip includes a first pad electrode and a second pad electrode adjacent to the first pad electrode, and
    the first pad electrode is connected to the first electrode and the second pad electrode is connected to the second electrode via the conductive members, respectively.

3. The LED module according to claim 1, wherein the first electrode is arranged along an upper surface and a side surface of the first protrusion, and the second electrode is arranged along an upper surface and a side surface of the second protrusion.

4. The LED module according to claim 1, further comprising a third protrusion arranged between the first protrusion and the second protrusion.

5. The LED module according to claim 1, wherein the LED chip is a micro LED chip.

6. A display device, comprising:
- a first protrusion and a second protrusion adjacent to the first protrusion arranged in a region where pixels of an insulating surface are arranged;
- a first electrode arranged on the first protrusion, and a second electrode arranged on the second protrusion;
- an LED chip arranged on upper sides of the first protrusion and the second protrusion;
- a first wiring covering at least a part of the first protrusion, and a second wiring covering at least a part of the region of the second protrusion, wherein
- the LED chip is connected to the first electrode and the second electrode via conductive members, and
- the first protrusion and the second protrusion are insulative and have a height of 1 μm to 50 μm,
- the first protrusion has a first through hole exposing the first wiring, and the second protrusion has a second through hole exposing the second wiring, and
- the first electrode is connected to the first wiring via the first through hole, and the second electrode is connected to the second wiring via the second through hole.

7. The display device according to claim 6, wherein the LED chip includes a first pad electrode and a second pad electrode adjacent to the first pad electrode, and
- the first pad electrode is connected to the first electrode and the second pad electrode is connected to the second electrode via the conductive members, respectively.

8. The display device according to claim 6, wherein the first wiring is a scanning signal line, and the second wiring is a data signal line.

9. The display device according to claim 6, further comprising a third protrusion arranged between the first protrusion and the second protrusion.

10. The display device according to claim 6, wherein the LED chip is a micro LED chip.

11. An LED module, comprising:
- a first protrusion and a second protrusion adjacent to the first protrusion arranged on an insulating surface;
- a first electrode arranged on the first protrusion, and a second electrode arranged on the second protrusion; and
- an LED chip arranged on an upper sides of the first protrusion and the second protrusion;
- a first wiring covering at least a part of the first protrusion, and a second wiring covering at least a part of a region of the second protrusion, wherein
- the LED chip is connected to the first electrode and the second electrode via conductive members, and
- the first protrusion and the second protrusion are insulative and have a height of 1 μm to 50 μm,
- the first protrusion has a first through hole exposing the first wiring, and the second protrusion has a second through hole exposing the second wiring, and
- the first electrode is connected to the first wiring via the first through hole, and the second electrode is connected to the second wiring via the second through hole.

12. The LED module according to claim 11, wherein the side surfaces of the first protrusion and the second protrusion are inclined surfaces.

13. The LED module according to claim 11, further comprising a third protrusion arranged between the first protrusion and the second protrusion.

14. The LED module according to claim 11, wherein the LED chip is a micro LED chip.

15. A display device, comprising:
- a first protrusion and a second protrusion adjacent to the first protrusion arranged in a region where pixels of an insulating surface are arranged;
- a first electrode arranged on the first protrusion, and a second electrode arranged on the second protrusion; and
- an LED chip arranged on upper sides of the first protrusion and the second protrusion, wherein
- the LED chip is connected to the first electrode and the second electrode via conductive members, and
- the first protrusion and the second protrusion are insulative and have a height of 1 μm to 50 μm, and
- the first electrode is arranged along an upper surface and a side surface of the first protrusion, and the second electrode is arranged along an upper surface and a side surface of the second protrusion.

16. The display device according to claim 15, wherein the side surfaces of the first protrusion and the second protrusion are inclined surfaces.

17. The display device according to claim 15, further comprising a first wiring not overlapping the first protrusion, and a second wiring not overlapping the second protrusion, wherein
- the first electrode is connected to the first wiring outside the first protrusion, and the second electrode is connected to the second wiring outside the second protrusion.

18. The display device according to claim 15, further comprising a third protrusion arranged between the first protrusion and the second protrusion.

19. The display device according to claim 15, wherein the LED chip is a micro LED chip.

* * * * *